(12) United States Patent
Horiba

(10) Patent No.: US 6,429,478 B1
(45) Date of Patent: Aug. 6, 2002

(54) SEMICONDUCTOR DEVICE WHICH INCREASES THE CAPACITY OF A CAPACITOR WITHOUT DEEPENING THE CONTACT HOLE

(75) Inventor: Shinichi Horiba, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/645,061

(22) Filed: Aug. 24, 2000

(30) Foreign Application Priority Data

Aug. 27, 1999 (JP) .......................................... 11-240852

(51) Int. Cl.[7] ...................... H01L 27/108; H01L 29/76; H01L 29/94
(52) U.S. Cl. .................. 257/302; 257/301; 257/296
(58) Field of Search ................... 257/301, 302, 257/637, 640, 296

(56) References Cited

U.S. PATENT DOCUMENTS 5,994,733 A  * 11/1999 Nishioka et al. ............. 257/316
6,194,309 B1 *  2/2001 Jin .............................. 438/639
6,268,244 B1 *  7/2001 Park ............................ 438/253

FOREIGN PATENT DOCUMENTS

| JP | 5-136369 | 6/1993 |
|---|---|---|
| JP | 8-125141 | 5/1996 |
| JP | 9-64297 | 3/1997 |
| JP | 9-97902 | 4/1997 |
| JP | 9-321024 | 12/1997 |
| JP | 10-74909 | 3/1998 |
| JP | 2850833 | 11/1998 |
| JP | 11-16886 | 1/1999 |
| JP | 11-87653 | 3/1999 |

* cited by examiner

Primary Examiner—Michael S. Lebentritt
Assistant Examiner—Brad Smith
(74) Attorney, Agent, or Firm—Scully, Scott, Murphy & Presser

(57) ABSTRACT

There is provided a semiconductor memory device including (a) a semiconductor substrate on which a circuit is formed, (b) a first interlayer insulating film formed on the semiconductor substrate, (c) a plurality of bit lines formed on the first interlayer insulating film, a contact hole being formed through the first interlayer insulating film between adjacent bit lines such that the contact hole reaches the semiconductor substrate, (d) a second interlayer insulating film formed on the first interlayer insulating film such that the second interlayer insulating film covers the bit lines therewith, (e) a first electrically conductive layer buried in the contact hole, a recess being formed through the second interlayer insulating film between adjacent bit lines such that the recess reaches the first electrically conductive layer, and (f) a second electrically conductive layer covering a bottom and an inner sidewall of the recess therewith such that the second electrically conductive layer is electrically isolated from the bit lines. The semiconductor memory device makes it possible to increase a capacity of a capacitor without increasing a depth of a contact hole reaching a peripheral circuit.

12 Claims, 12 Drawing Sheets

SEMICONDUCTOR DEVICE WHICH INCREASES THE CAPACITY OF A CAPACITOR WITHOUT DEEPENING THE CONTACT HOLE

BACKGROUND OF THE INVENTION

1. Field of the Invention

The invention relates to a semiconductor memory device and a method of fabricating the same, and more particularly to a semiconductor memory device storing data by accumulating electric charges in a capacitor formed in the device, and a method of fabricating the same.

2. Description of the Related Art

A dynamic random access memory (DRAM) is one of memories comprises of a transistor and a capacitor. FIGS. 1A to 1E are cross-sectional view of a cell in a conventional dynamic random access memory, each illustrating a step of a method of fabricating the same.

First, as illustrated in FIG. 1A, isolating regions 2 are formed at a surface of a semiconductor substrate 1 by the shallow trench isolation (STI) process. The adjacent isolation regions 2 define a region therebetween in which a transistor is to be fabricated.

Then, transistors (not illustrated) are fabricated between the isolation regions 2, followed by ion-implantation to the semiconductor substrate 1 between the isolation regions 2 to thereby form diffusion layers 3 at a surface of the semiconductor substrate 1.

Then, a first interlayer insulating film 4 is formed on the semiconductor substrate 1. After planarization of the first interlayer insulating film 4 by chemical mechanical polishing (CMP), a photoresist film (not illustrated) is deposited on the first interlayer insulating film 4. After patterning the photoresist film, the first interlayer insulating film 4 is etched with the patterned photoresist film being used as a mask, to thereby form contact holes 5 throughout the first interlayer insulating film 4 such that the contact holes 5 reach the diffusion layer 3.

Then, polysilicon is grown entirely over the first interlayer insulating film 4 and the diffusion layer 3, and thereafter, is etched back by dry etching. As a result, the polysilicon remains non-etched only in the contact holes 5. The polysilicon remaining in the contact holes 5 defines first electrically conductive layers 6 acting as pads.

Then, as illustrated in FIG. 1B, an interlayer insulating film 7 is formed entirely over the second interlayer insulating film 4 and the first electrically conductive layers 6. Then, there are formed contact holes (not illustrated) through both the interlayer insulating film 7 and the first interlayer insulating film 4 such that the contact holes connect later mentioned bit lines to a circuit (not illustrated) formed on the semiconductor substrate 1.

Then, a tungsten polycide film is formed on the interlayer insulating film 7. Then, the tungsten polycide film is patterned by photolithography and etching to thereby form bit lines 8 on the interlayer insulating film 7.

Then, as illustrated in FIG. 1C, a second interlayer insulating film 9 is formed on the interlayer insulating film such that the bit line 8 are entirely covered with the second interlayer insulating film 9. After planarizing the second interlayer insulating film 9, contact holes 10 are formed throughout the second interlayer insulating film 9 by photolithography and etching such that the contact holes 10 reach the first electrically conductive layers 6.

Then, the contact holes 10 are filled with polysilicon to thereby form plugs 11 in the contact holes 10 in the same manner as forming the first electrically conductive layers 6.

Then, as illustrated in FIG. 1D, a third interlayer insulating film 12 is formed entirely over the second interlayer insulating film 9 and the plugs 11. Then, the third interlayer insulating film 12 is patterned by photolithography and etching to thereby form recesses 13 throughout the third interlayer insulating film 12 such that the recesses 13 reach the plugs 11.

Then, as illustrated in FIG. 1E, each of the recesses 13 is covered at its inner sidewall and bottom with a lower electrode 14 composed of polysilicon.

It is preferable for a capacitor to have a greater capacity for writing data thereinto or reading data therefrom. In order to enhance a capacity of a capacitor, each of the recesses 13 illustrated in FIG. 1E needs to have a greater surface area, that is, the lower electrode 14 needs to have a greater height. To this end, the third interlayer insulating film 12 needs to have a greater thickness.

However, if the third interlayer insulating film 12 is designed to have a greater thickness, the contact holes 5, 10 and 13 reaching the circuit formed on the semiconductor substrate 1 have to have a greater depth, resulting in an increase in difficulty for fabricating the semiconductor memory device.

A memory used in a computer has been designed to have a greater capacity, and a cell in a semiconductor memory device has been designed to be fabricated in a smaller size. Accordingly, there is caused a problem that it is more and more difficult to stably pattern a photoresist film for forming the contact holes 10 in accordance with a minimum design rule.

For instance, Japanese Patent No. 2850833 (Japanese Unexamined Patent Publication No. 9-232427) has suggested a method of fabricating a semiconductor device, including the steps of forming a plurality of wirings on a semiconductor substrate, forming a sidewall layer around each of sidewalls of the wirings, forming an interlayer insulating film covering the wirings and the sidewall layers therewith, and etching both the interlayer insulating layer and the sidewall layers by making an etching rate of the sidewall layers equal to or greater than an etching rate of the interlayer insulating film, to thereby form contact holes between the wirings. Each of the sidewall layers is comprised of a silicon dioxide film into which impurity is doped, and a coat insulating film keeping the silicon dioxide film away from the semiconductor substrate by covering both sidewalls of the wirings and the semiconductor substrate therewith.

Japanese Unexamined Patent Publication No. 9-97902 has suggested a method of fabricating a semiconductor device, including the steps of forming a first wiring layer on a semiconductor substrate, a forming a first etching stopper film covering the first wiring layer therewith, forming a first interlayer insulating film over the first etching stopper film and the semiconductor substrate, forming a second wiring layer on the first interlayer insulating film, forming a second etching stopper film on the second wiring layer such that the second etching stopper film is horizontally more extensive than the second wiring layer and projects from a sidewall of the second wiring layer, forming a second interlayer insulating film on the semiconductor substrate, and forming a contact hole extending from a surface of the second interlayer insulating film to either a surface of the first etching stopper film or a surface of the semiconductor substrate. An etching mask formed on the second interlayer insulating film is composed of the same material as a material of which the second etching stopper film is composed.

Japanese Unexamined Patent Publication No. 9-321024 has suggested a method of fabricating a semiconductor device, including the steps of etching a silicon dioxide film relative to a silicon nitride film through the use of a first process gas containing phlorocarbon gas having no hydrogen bondings, and etching the silicon dioxide film relative to the silicon nitride film through the use of a second process gas containing CO gas and phlorocarbon gas having hydrogen bondings.

Japanese Unexamined Patent Publication No. 11-87653 has suggested a method of fabricating a semiconductor device, including the steps of forming a gate insulating film in active regions on a semiconductor substrate, forming a plurality of first gate electrodes in a first region and a plurality of second gate electrodes in a second region, the first gate electrodes having a high patterning density and the second gate electrodes having a low patterning density, forming source and drain regions in the semiconductor substrate around each of the first and second gate electrodes, forming a first insulating film on the semiconductor substrate so that the first insulating film covers the first and second gate electrodes therewith, forming a second insulating film on the first insulating film, the second insulating film having different etching characteristic from that of the first insulating film, forming an interlayer insulating film on the semiconductor substrate so that the interlayer insulating film covers the second insulating film in the first region and the second gate electrodes in the second region therewith, the interlayer insulating film having different etching characteristic from that of the second insulating film, and forming a hole in a self-aligning manner in the first region by using the second insulating film as an etching stopper, the hole extending throughout the interlayer insulating film and the first insulating film, making contact with the first insulating film, and reaching one of the source and drain regions.

Japanese Unexamined Patent Publication No. 11-16886 has suggested a method of etching a silicon dioxide film exposed through openings of a resist mask formed on a semiconductor substrate, through the use of a gas containing fluorocarbon gas and alcohol.

The above-mentioned problems remain unsolved even in the above-mentioned Publications.

SUMMARY OF THE INVENTION

It is an object of the present invention to provide a semiconductor memory device which is capable of increasing a capacity of a capacitor without deepening a contact hole reaching a peripheral circuit, and forming a recess defining a capacitor, in a self-aligning manner not in accordance with a minimum design rule.

It is also an object of the present invention to provide a method of fabricating such a semiconductor memory device.

In one aspect of the present invention, there is provided a semiconductor memory device including (a) a semiconductor substrate on which a circuit is formed, (b) a first interlayer insulating film formed on the semiconductor substrate, (c) a plurality of bit lines formed on the first interlayer insulating film, a contact hole being formed through the first interlayer insulating film between adjacent bit lines such that the contact hole reaches the semiconductor substrate, (d) a second interlayer insulating film formed on the first interlayer insulating film such that the second interlayer insulating film covers the bit lines therewith, (e) a first electrically conductive layer buried in the contact hole, a recess being formed through the second interlayer insulating film between adjacent bit lines such that the recess reaches the first electrically conductive layer, and (f) a second electrically conductive layer covering a bottom and an inner sidewall of the recess therewith such that the second electrically conductive layer is electrically isolated from the bit lines.

In the conventional semiconductor memory device, a recess for defining a capacitor is formed only above bit lines. In contrast, in accordance with the present invention, the recess for defining a capacitor is formed not only above bit lines but also at the side of bit lines. Hence, it is possible to increase a capacity of a capacitor without an increase in a thickness of an interlayer insulating film in which a recess for defining a capacitor is to be formed.

It is preferable that the semiconductor memory device further includes an insulating film covering upper and side surfaces of the bit lines therewith. The insulating film formed around a first bit line and the insulating film formed around a second bit line adjacent to the first bit line both partially defines a part of the inner sidewall of the recess, the bottom of the recess being extensive between the insulating films.

In accordance with this arrangement, the recess can be formed not in accordance with a minimum design rule but in a self-aligning manner by etching the second interlayer insulating film with the insulating film being used as an etching stopper, ensuring reduction in the number of fabrication steps.

It is preferable that the insulating film is composed of silicon nitride, and the second interlayer insulating film is composed of silicon dioxide.

A film composed of silicon dioxide has a dielectric constant about half of a dielectric constant of a film composed of a silicon nitride. For instance, a silicon nitride film has a dielectric constant of 7.5, whereas a silicon dioxide film has a dielectric constant of 3.9. Thus, a combination of a silicon nitride film and a silicon dioxide film would reduce a capacity of a bit line. The capacity defined between the bit line and the second electrically conductive layer is greatest.

In other words, in accordance with the present invention, since the recess is formed reaching a layer on which the bit lines are formed, it would be possible to increase a capacity of a capacitor, even if an interlayer insulating film in which the recess is to be formed did not have an increased thickness.

It is preferable that the semiconductor memory device further includes a second insulating film sandwiched between each of the bit lines and the insulating film, in which case, it is preferable that the insulating film is composed of silicon nitride, the second interlayer insulating film is composed of silicon dioxide, and the second insulating film is composed of silicon dioxide.

It is preferable that the semiconductor memory device further includes a third interlayer insulating film sandwiched between the first and second interlayer insulating films, the bit lines being formed on the third interlayer insulating film, the recess being formed through the second and third interlayer insulating films between adjacent bit lines such that the recess reaches the first electrically conductive layer.

For instance, the third interlayer insulating film is composed of silicon dioxide.

There is further provided a semiconductor memory device including (a) a semiconductor substrate on which a circuit is formed, (b) a first interlayer insulating film formed on the semiconductor substrate, (c) a plurality of bit lines formed on the first interlayer insulating film, a contact hole being formed through the first interlayer insulating film between adjacent bit lines such that the contact hole reaches the semiconductor substrate, (d) a first insulating film covering an upper surface of each of the bit lines therewith, (e) a second interlayer insulating film formed on the first interlayer insulating film such that the second interlayer insulating film covers both the first insulating film and the bit lines therewith, (e) a first electrically conductive layer buried in the contact hole, a recess being formed through the second interlayer insulating film between adjacent bit lines such that the recess reaches the first electrically conductive layer, (f) a second insulating film formed on an inner sidewall of the recess, and (g) a second electrically conductive layer formed on the second insulating film and covering a bottom of the recess therewith.

In another aspect of the present invention, there is provided a method of fabricating a semiconductor memory device, including the steps of (a) forming a first interlayer insulating film on a semiconductor substrate, (b) forming a plurality of contact holes through the first interlayer insulating film, (c) forming a first electrically conductive layer in each of the contact holes, (d) forming a pattern of a wiring layer on the first interlayer insulating film such that the wiring layer is located between the contact holes when viewed from above, (e) covering the wiring layer at its upper and side surfaces with an etching stopper film, (f) forming a second interlayer insulating film on the first interlayer insulating film such that the second interlayer insulating film covers the etching stopper film therewith, (g) forming a recess through the second interlayer insulating film such that the etching stopper film formed around a first wiring layer and the etching stopper film formed around a second wiring layer adjacent to the first wiring layer are both exposed to the recess and that the recess reaches the first electrically conductive layer, and (h) forming a second electrically conductive layer such that the recess is covered at its inner sidewall and a bottom with the second electrically conductive layer.

It is preferable that the etching stopper film is composed of silicon nitride, and the second interlayer insulating film is composed of silicon dioxide.

It is preferable that the method further includes the step (i) of forming an insulating film on the wiring layer, the step (i) being carried out between the steps (d) and (e).

It is preferable that the insulating film is composed of silicon dioxide.

It is preferable that the method further includes the step (j) of forming a third interlayer insulating film on the first interlayer insulating film, the step (j) being carried out between the steps (c) and (d), the wiring layer being formed on the third interlayer insulating film.

There is further provided a method of fabricating a semiconductor memory device, including the steps of (a) forming a first interlayer insulating film on a semiconductor substrate, (b) forming a plurality of contact holes through the first interlayer insulating film, (c) forming a first electrically conductive layer in each of the contact holes, (d) forming a pattern of a wiring layer on the first interlayer insulating film such that the wiring layer is located between the contact holes when viewed from above, (e) covering the wiring layer at its upper surface with a first insulating film, (f) forming a second interlayer insulating film such that the second interlayer insulating film covers the first insulating film and the wiring layer therewith, (g) forming a recess through the second interlayer insulating film such that the first insulating film formed around a first wiring layer and the first insulating film formed around a second wiring layer adjacent to the first wiring layer are both exposed to the recess and that the recess reaches the first electrically conductive layer, (h) covering the recess at its inner sidewall with a second insulating film, and (i) forming a second electrically conductive layer such that the second insulating film and a bottom of the recess are covered with the second electrically conductive layer.

It is preferable that the first insulating film is composed of silicon nitride, the second interlayer insulating film is composed of silicon dioxide, and the second insulating film is composed of silicon dioxide.

The advantages obtained by the aforementioned present invention will be described hereinbelow.

In accordance with the present invention, the recess for defining a capacitor is formed throughout the second interlayer insulating film and reaches the first electrically conductive film. As a result, the recess is formed not only above the bit lines but also at the side of the bit lines. Hence, it is possible to increase a capacity of a capacitor without an increase in a thickness of an interlayer insulating film in which the recess is to be formed.

The etching stopper film formed around a first bit line and the etching stopper film formed around a second bit line located adjacent to the first bit line can be exposed to the recess by covering the bit lines with the etching stopper film, forming the second interlayer insulating film so that the etching stopper film is covered with the second interlayer insulating film, and etching the second interlayer insulating film. Thus, the recess can be formed not in accordance with a minimum design rule but in a self-aligning manner, ensuring reduction in the number of fabrication steps.

In addition, it would be possible to reduce a capacity of the bit lines by using a silicon dioxide film together with the etching stopper film composed of silicon nitride, or by partially replacing the silicon nitride film with a silicon dioxide film, because silicon dioxide has a smaller dielectric constant than that of silicon nitride.

Thus, the present invention makes it possible to increase a capacity of a capacitor without deepening a contact hole reaching a peripheral circuit. In addition, it is possible to reduce the number of fabrication steps, since the recess can be formed in a self-aligning manner.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

[First Embodiment]

Figure 2A:
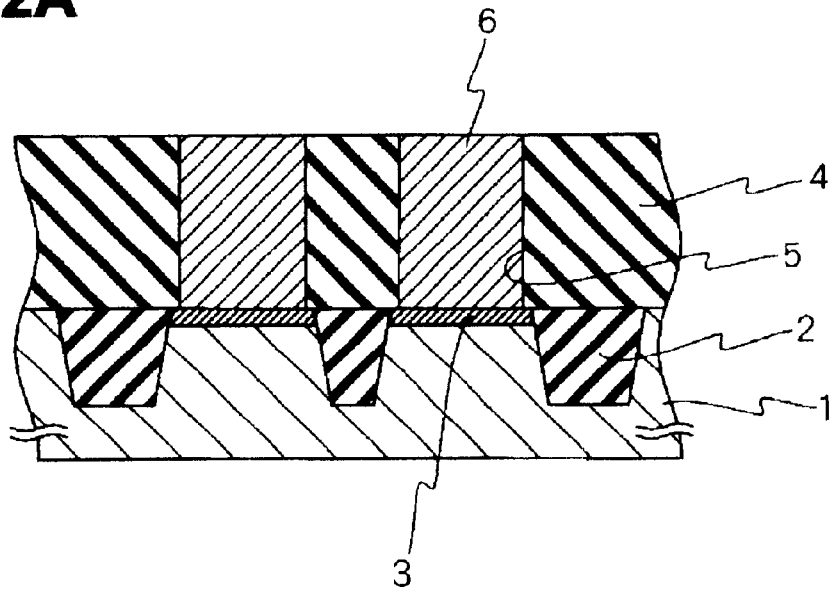
FIGS. 2A to 2E are cross-sectional views of a dynamic random access memory in accordance with the first embodiment of the present invention, each illustrating a step of a method of fabricating the same.
Figure 2B:
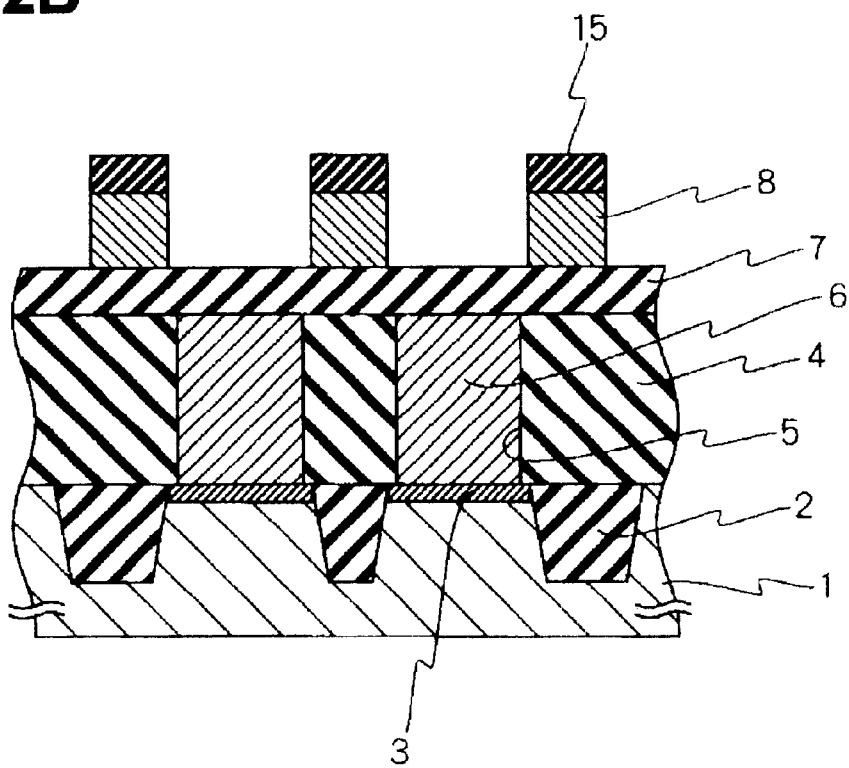
Figure 2C:
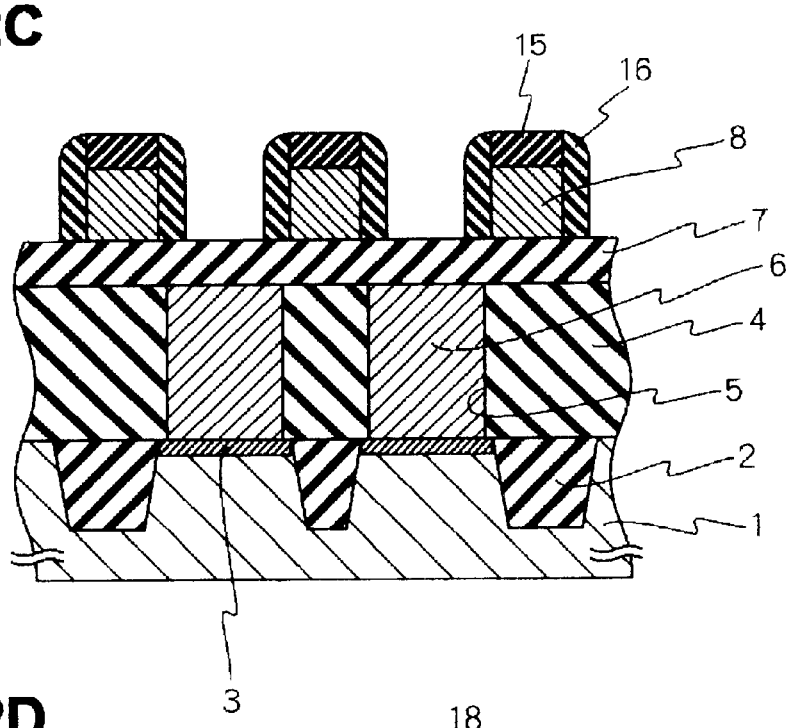
Figure 2D:
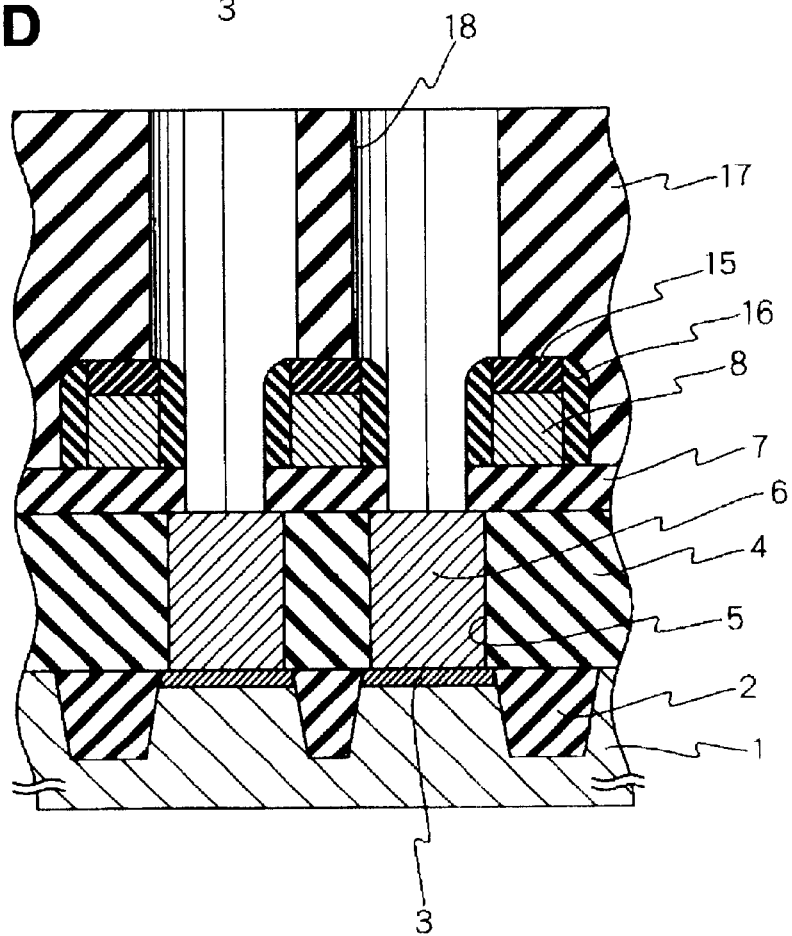
Figure 2E:
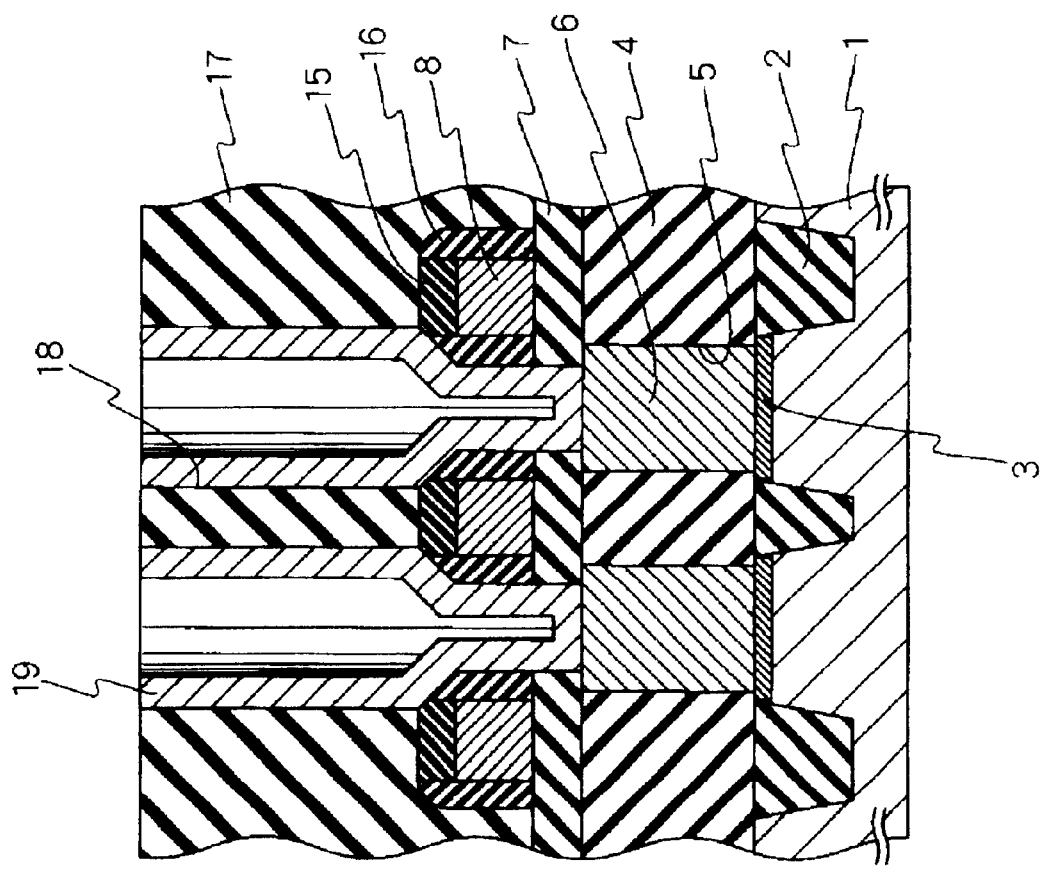

FIG. 2E is a cross-sectional view of the dynamic random access memory (DRAM) in accordance with the first embodiment.

The dynamic random access memory is comprised of a semiconductor substrate 1 on which a circuit is formed, isolation regions 2 formed at a surface of the semiconductor substrate 1, a diffusion layer 3 formed at a surface of the semiconductor substrate 1 between the isolation regions 2, a first interlayer insulating 4 film formed on the semiconductor substrate 1, contact holes 5 being formed through the first interlayer insulating film 4 between later mentioned adjacent bit lines 8 such that the contact holes 5 reach the diffusion layer 3, first electrically conductive layers 6 buried in the contact holes 5, a third interlayer insulating film 7 formed on the first interlayer insulating film 4 and having openings in alignment with the contact holes 5, a plurality of bit lines 8 formed on the third interlayer insulating film 7, a first insulating film 15 covering each of the bit lines 8 at its upper surface therewith, a second insulating film 16 covering each of the bit lines 8 at its side surface therewith, a second interlayer insulating film 17 formed on the third interlayer insulating film 7 such that the second interlayer insulating film 17 covers the first and second insulating films 15 and 16 therewith, recesses 18 being formed throughout the second and third interlayer insulating films 17 and 7 and reaching the first electrically conductive films 16, and second electrically conductive layers 19 covering a bottom and an inner sidewall of each of the recesses 18 therewith.

The second insulating films 16 formed around one of the bit lines 8 and the second insulating film 16 formed around the adjacent bit line 8 both partially defining a part of an inner sidewall of the recess 18.

The first and second insulating films 15 and 16 are composed of silicon nitride, the second interlayer insulating film 17 is composed of silicon dioxide, and the third interlayer insulating film 7 is composed of silicon dioxide.

Hereinbelow is explained a method of fabricating the dynamic random access memory in accordance with the first embodiment, with reference to FIGS. 2A to 2E.

First, as illustrated in FIG. 2A, the isolation regions 2 are formed at a surface of the semiconductor substrate 1 by the shallow trench isolation (STI) process. The adjacent isolation regions 2 define a region therebetween in which a transistor is to be fabricated.

Then, transistors (not illustrated) are fabricated between the isolation regions 2, followed by ion-implantation to the semiconductor substrate 1 between he isolation regions 2 to thereby form the diffusion layers 3 at a surface of the semiconductor substrate 1.

Then, a first interlayer insulating film 4 is formed on the semiconductor substrate 1. The first interlayer insulating film 4 is composed of BPSG (boron phospho silicate glass) and has a thickness of 8000 angstroms. Then, the first interlayer insulating film 4 is polished by about 4000 angstroms by CMP to thereby planarize the first interlayer insulating film 4.

Then, a photoresist film (not illustrated) is deposited on the first interlayer insulating film 4. After patterning the photoresist film, the first interlayer insulating film 4 is etched with the patterned photoresist film being used as a mask, to thereby form the contact holes 5 throughout the first interlayer insulating film 4 such that the contact holes 5 reach the diffusion layer 3.

Then, polysilicon is grown by a thickness of about 5000 angstroms entirely over the first interlayer insulating film 4 and the diffusion layer 3, and thereafter, is etched back by dry etching. As a result, the polysilicon remains non-etched only in the contact holes 5. The polysilicon remaining in the contact holes 5 defines first electrically conductive layers 6 acting as pads.

Then, as illustrated in FIG. 2B, the third interlayer insulating film 7 is formed entirely over the second interlayer insulating film 4 and the first electrically conductive layers 6. The third interlayer insulating film 7 is composed of silicon dioxide and has a thickness of 1000 angstroms. Then, there are formed contact holes (not illustrated) through both the third and first interlayer insulating films 7 and 4 such that the contact holes connect the bit lines 8 to a circuit (not illustrated) formed on the semiconductor substrate 1.

Then, a tungsten polycide film is formed on the third interlayer insulating film 7 by a thickness of 2000 angstroms. Then, a silicon nitride film is formed on the tungsten polycide film by a thickness of 1000 angstroms. Then, both the tungsten polycide film and the silicon nitride film are patterned by photolithography and dry etching to thereby form the bit lines 8 composed of tungsten polycide and the first insulating films 15 composed of silicon nitride.

The reason why the bit lines 8 are formed above the first interlayer insulating film 4 having a great thickness is to keep the bit lines 8 which will be at a high voltage, away from a cell formed on the semiconductor substrate 1.

Then, a silicon nitride film is deposited entirely over the first insulating films 15 and the third interlayer insulating film 7 by a thickness of 1000 angstroms. Then, the silicon nitride film is etched back by dry etching to thereby form the second insulating film 16 at sidewalls of both the first insulating film 15 and the bit line 8, as illustrated in FIG. 2C. The second insulating film 16 is composed of silicon nitride. The first and second insulating films 15 and 16 act as an etching stopper film.

Then, as illustrated in FIG. 2D, the second interlayer insulating film 17 is formed entirely covering the first and second insulating films 15 and 16 and the third interlayer insulating film 7 therewith. The second interlayer insulating film 17 is composed of silicon dioxide and has a thickness of 1 $\mu$m.

After planarizing the second interlayer insulating film 17 by CMP, a photoresist film (not illustrated) is formed on the second interlayer insulating film 17. Then, the photoresist film is patterned by photolithography and etching. Then, the second interlayer insulating film 17 is dry-etched with the patterned photoresist film being used as a mask, under conditions for etching a silicon dioxide film relative to a silicon nitride film with a sufficiently high selection ratio. For instance, the second interlayer insulating film 17 is dry-etched through the use of a mixture gas of $CHF_3$ and CO.

As a result, there are formed recesses 18 throughout the second and third interlayer insulating films 17 and 7 with the first and second insulating films 15 and 16 being not etched. Each of the recesses 18 reaches the first electrically conductive layer 6. The second insulating film 16 is partially exposed to the recess 18.

Then, as illustrated in FIG. 2E, the recesses 18 are filled with polysilicon having a thickness of 800 angstroms. Then, the polysilicon is patterned by photolithography and dry etching to thereby form the lower electrode 19 in each of the recesses 18.

Figure 1A:
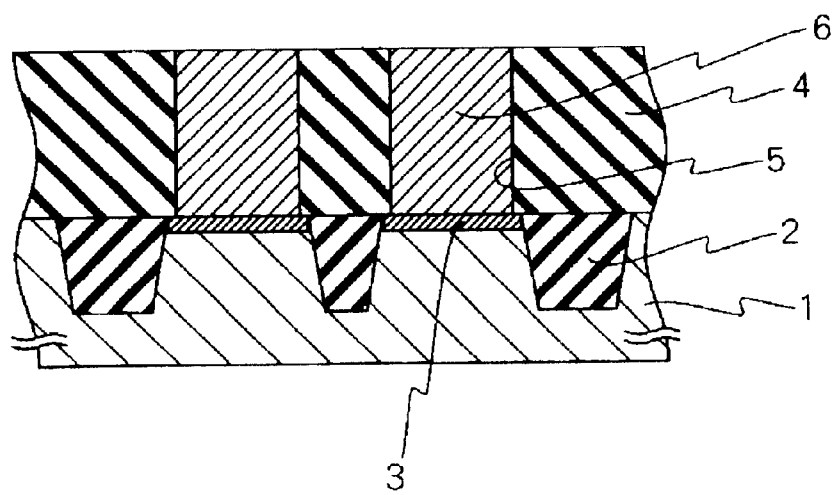
FIGS. 1A to 1E are cross-sectional views of a conventional dynamic random access memory, each illustrating a step of a method of fabricating the same.
Figure 1B:
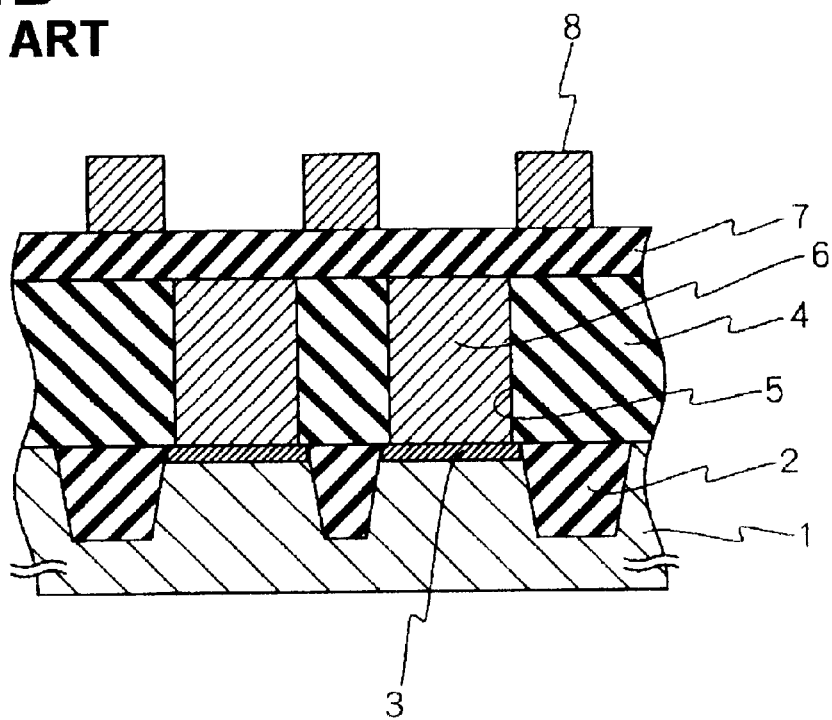
Figure 1C:
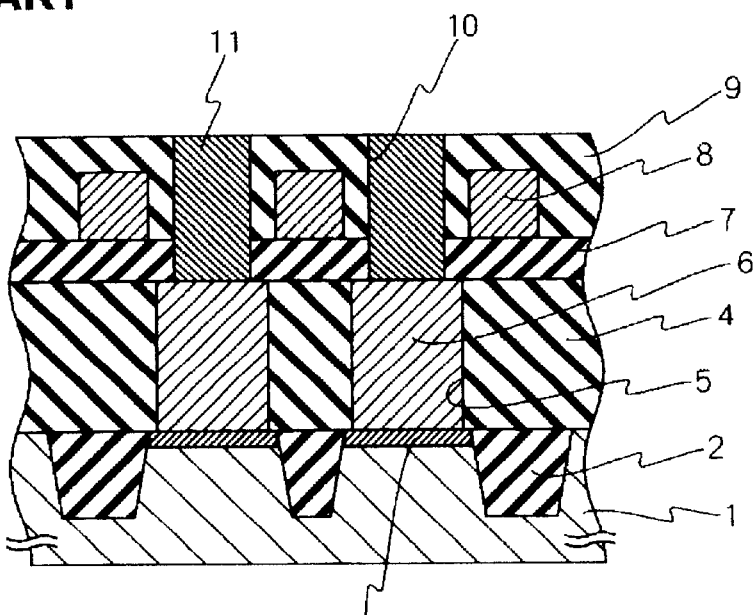
Figure 1D:
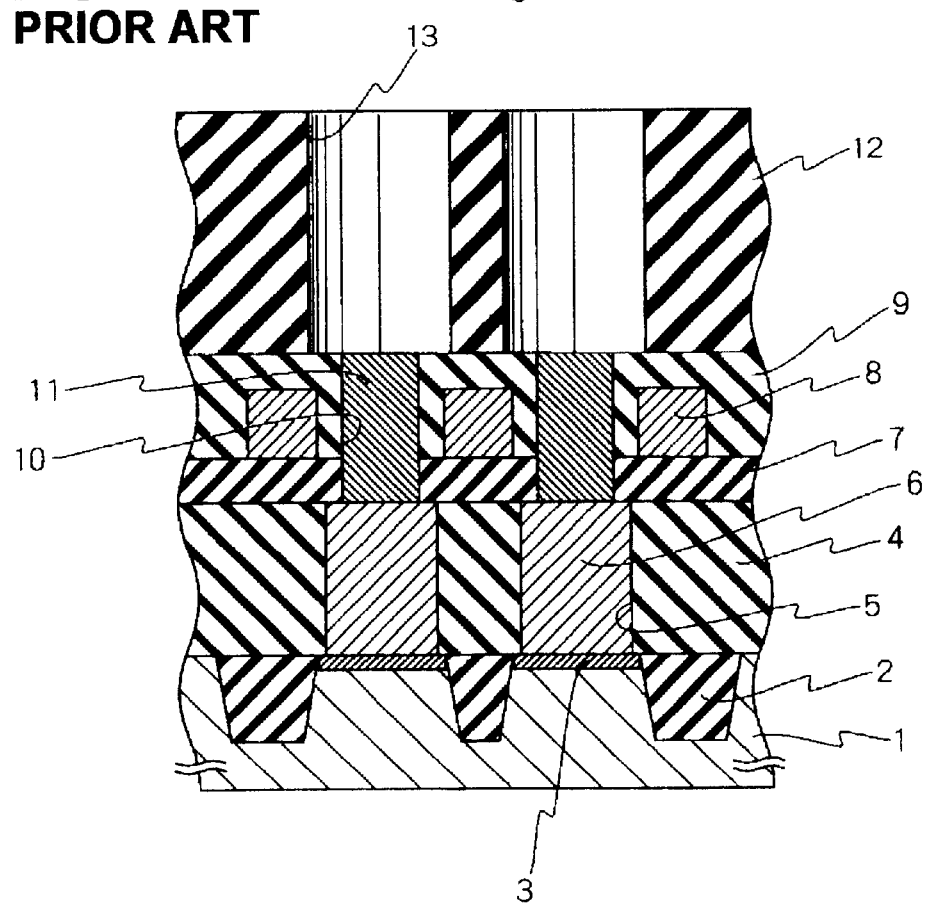
Figure 1E:
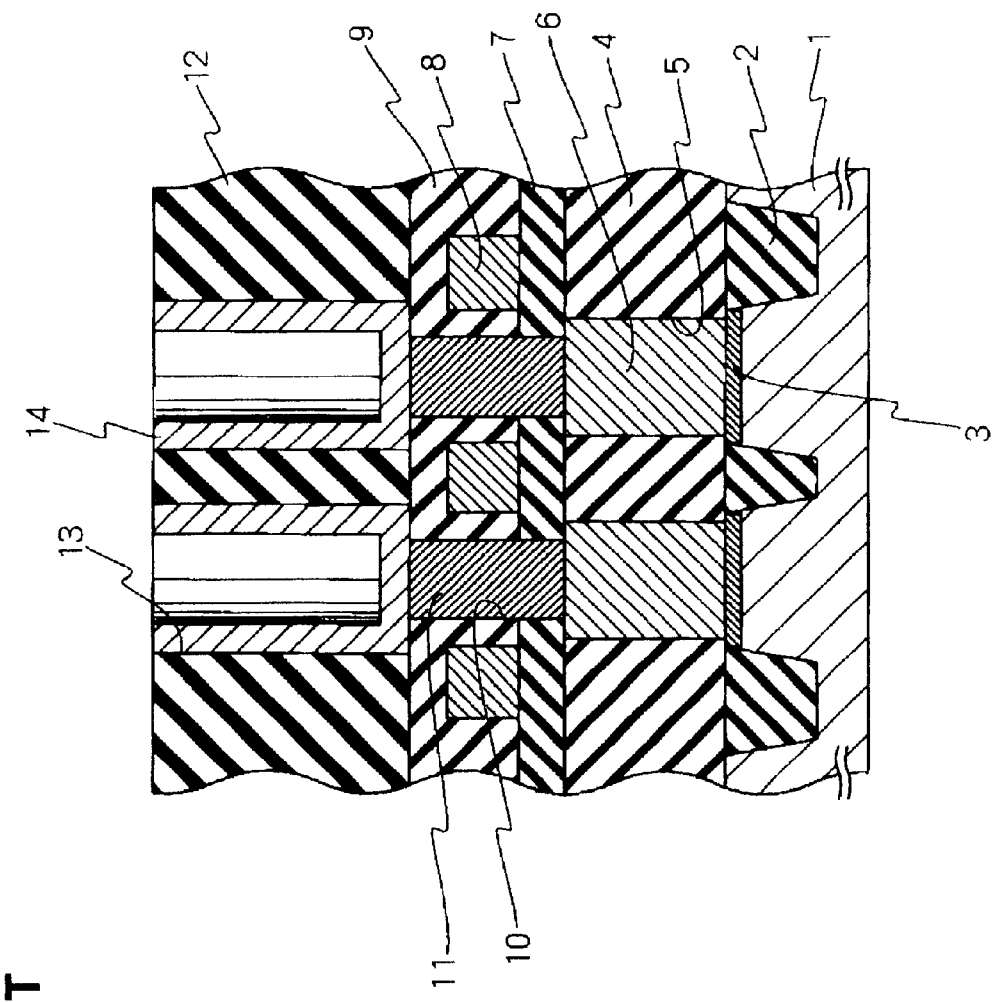

In accordance with the first embodiment, the recess 18 is formed throughout the second interlayer insulating film 17 in which the bit lines is formed, in comparison with the recess 13 illustrated in FIG. 1E. Hence, the recess 18 in the first embodiment can have a greater surface area and hence a greater capacity than those of the recess 13 in the conventional device illustrated in FIG. 1E. This ensures that the second interlayer insulating film 17 could have a smaller thickness, and that the contact holes to be formed to reach a peripheral circuit formed on the semiconductor substrate 1, throughout the second interlayer insulating film 17, could be shortened in length.

In addition, in accordance with the first embodiment, each of the bit lines 8 is protected by the first and second insulating films 15 and 16. Hence, it is no longer necessary to form contact holes throughout the third interlayer insulating film 7 in accordance with a specific minimum design rule, which contact holes correspond to the contact holes 10 illustrated in FIG. 1C. Since the contact holes can be formed together with the recesses 18 which can be formed in a self-aligning manner, it would be possible to reduce the number of fabrication steps and it would be no longer necessary to carry out precise registration.

[Second Embodiment]

Figure 3A:
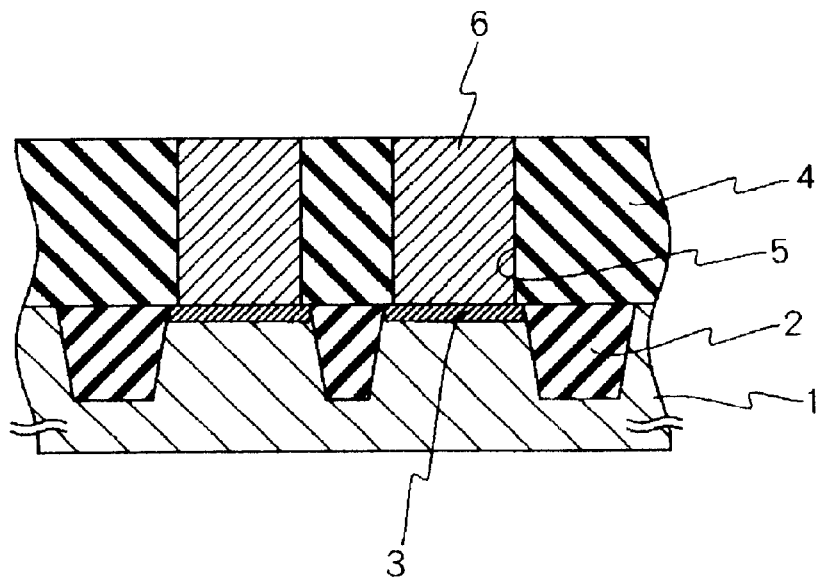
FIGS. 3A to 3E are cross-sectional views of a dynamic random access memory in accordance with the second embodiment of the present invention, each illustrating a step of a method of fabricating the same.
Figure 3B:
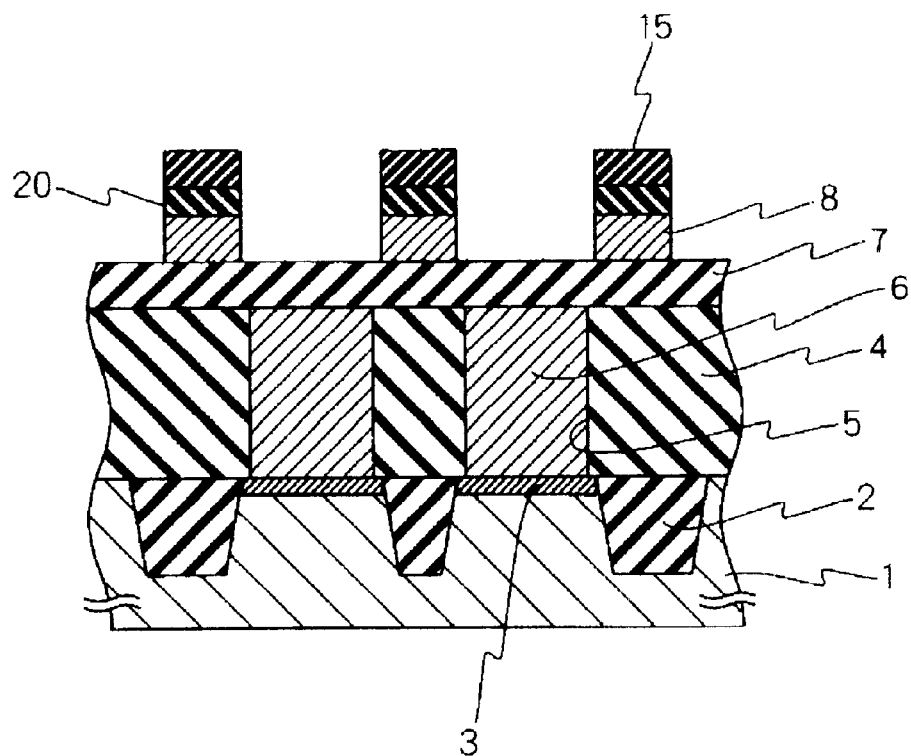
Figure 3C:
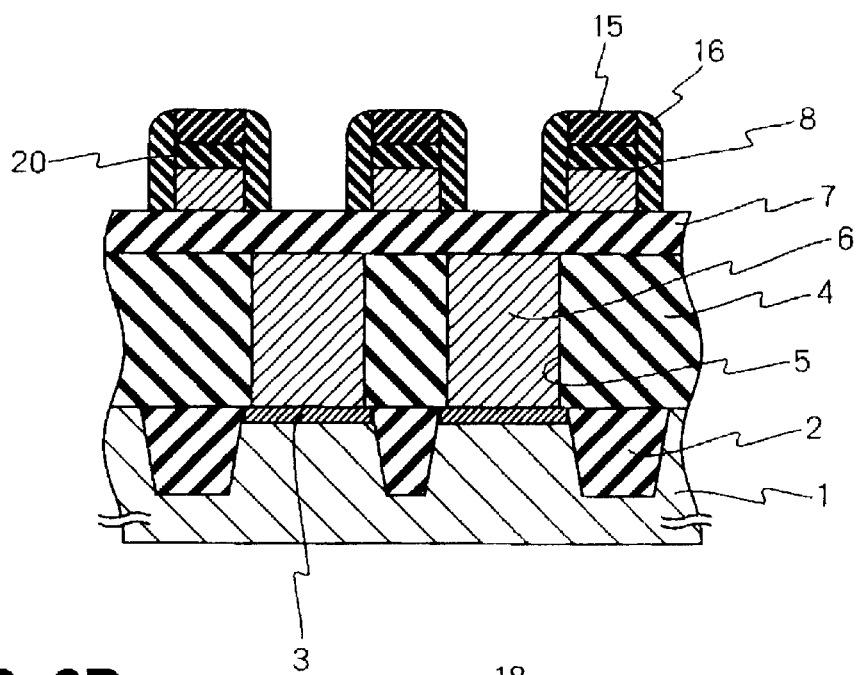
Figure 3D:
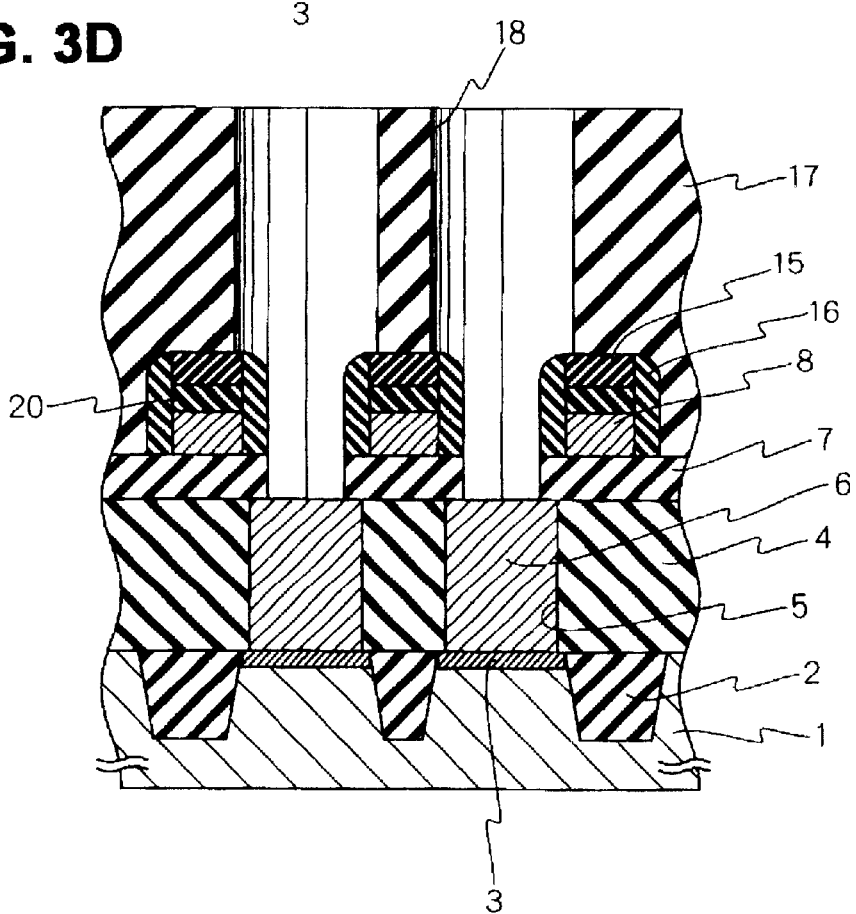
Figure 3E:
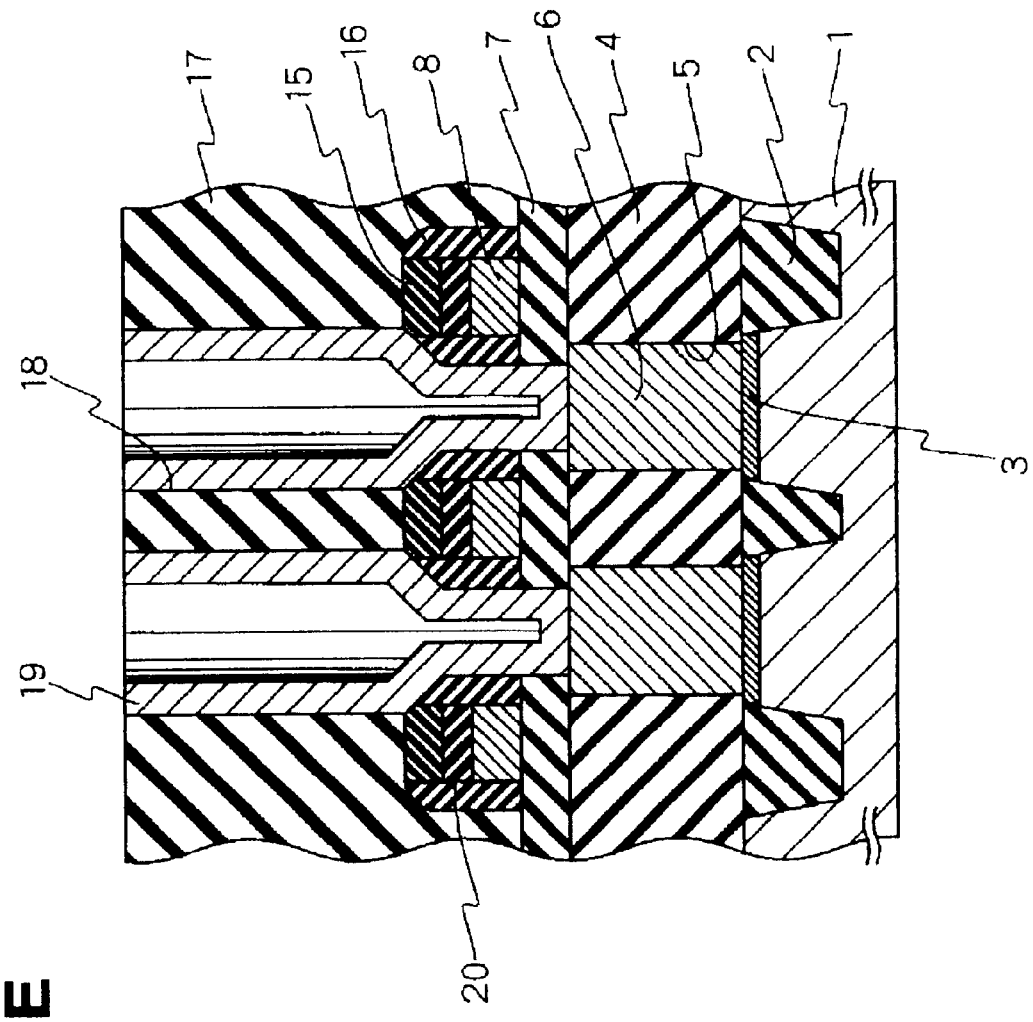

FIG. 3E is a cross-sectional view of the dynamic random access memory in accordance with the second embodiment.

As is readily understood in comparison of FIG. 3E to FIG. 2E, the dynamic random access memory in accordance with the second embodiment is structurally different from the dynamic random access memory in accordance with the first embodiment in further including a third insulating film 20 sandwiched between the bit line 8 and the first insulating film 15. The third insulating film 20 is composed of silicon dioxide.

FIGS. 3A to 3E are cross-sectional views of the dynamic random access memory in accordance with the second embodiment, each illustrating a step of a method of fabricating the same.

The method of fabricating the dynamic random access memory in accordance with the second embodiment is different from the method of fabricating the dynamic random access memory in accordance with the first embodiment in further including the steps of forming the silicon dioxide film 20 on the tungsten polycide film 8, and forming the silicon nitride film 15 on the silicon dioxide film 20, as illustrated in FIG. 3B. The tungsten polycide film 8 has a thickness of 2000 angstroms, the silicon dioxide film 20 has a thickness of 500 angstroms, and the silicon nitride film 15 has a thickness of 1000 angstroms. The other steps of fabricating the dynamic random access memory in accordance with the second embodiment are the same as the steps of fabricating the dynamic random access memory in accordance with the first embodiment.

The dynamic random access memory in accordance with the second embodiment has the same advantages as the advantages provided by the dynamic random access memory in accordance with the first embodiment. In addition, since the silicon dioxide film 20 is formed on the bit line 8, it would be possible to reduce a capacity of the bit lines 8 relative to the first embodiment, ensuring reduction in data delay.

[Third Embodiment]

Figure 4A:
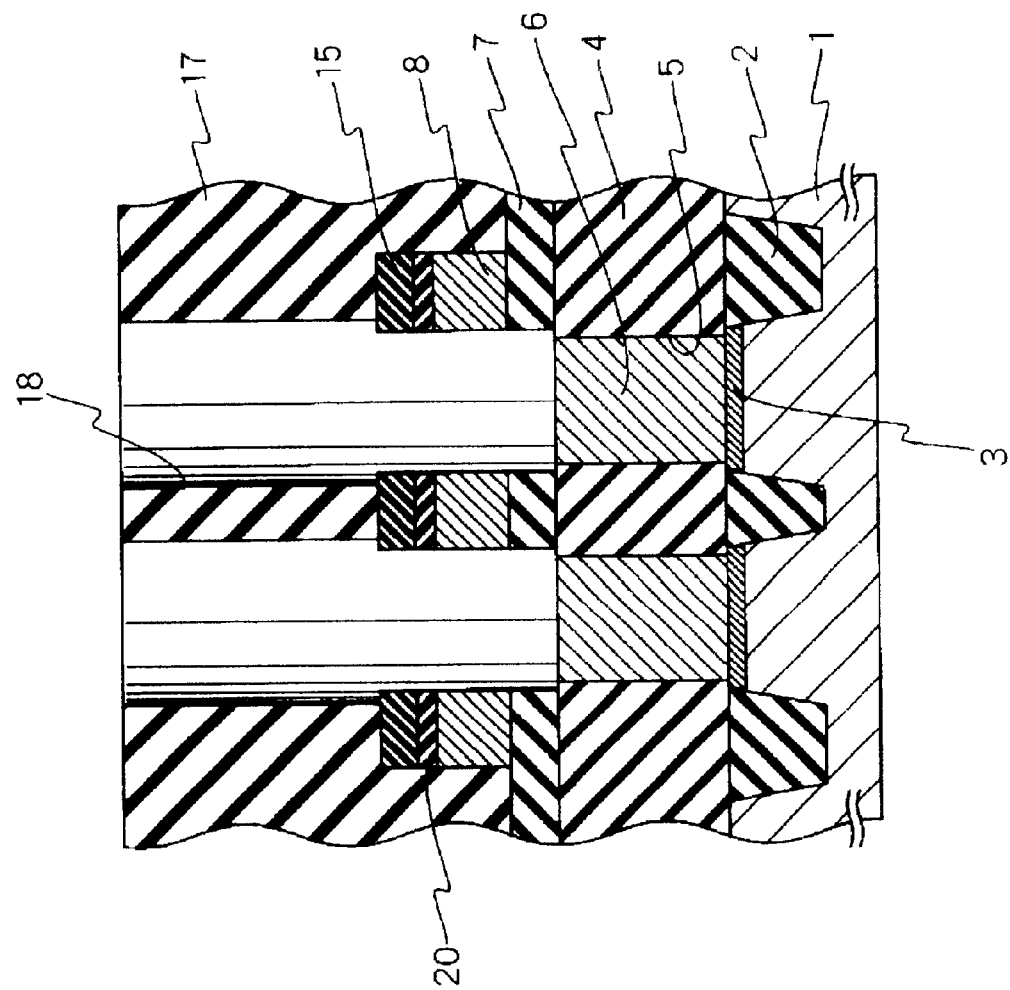
FIGS. 4A to 4C are cross-sectional views of a dynamic random access memory in accordance with the third embodiment of the present invention, each illustrating a step of a method of fabricating the same.
Figure 4B:
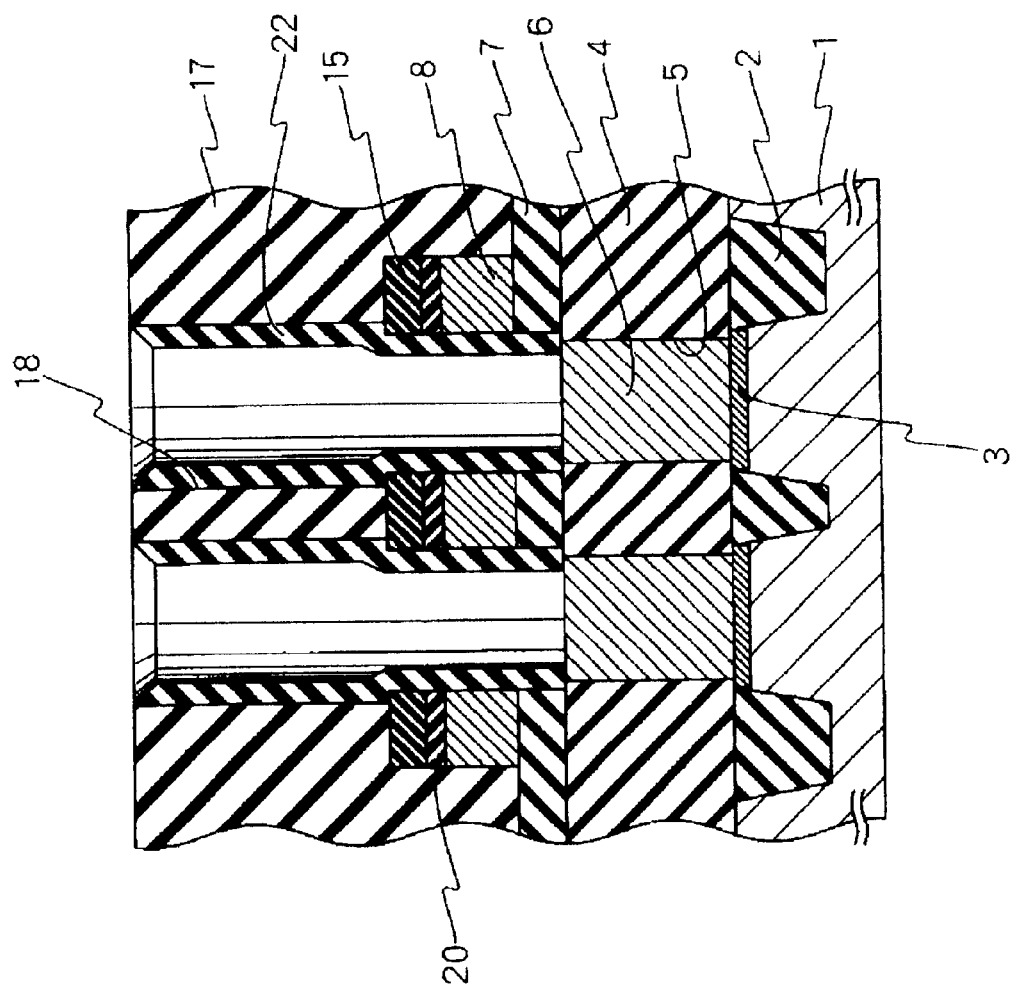
Figure 4C:
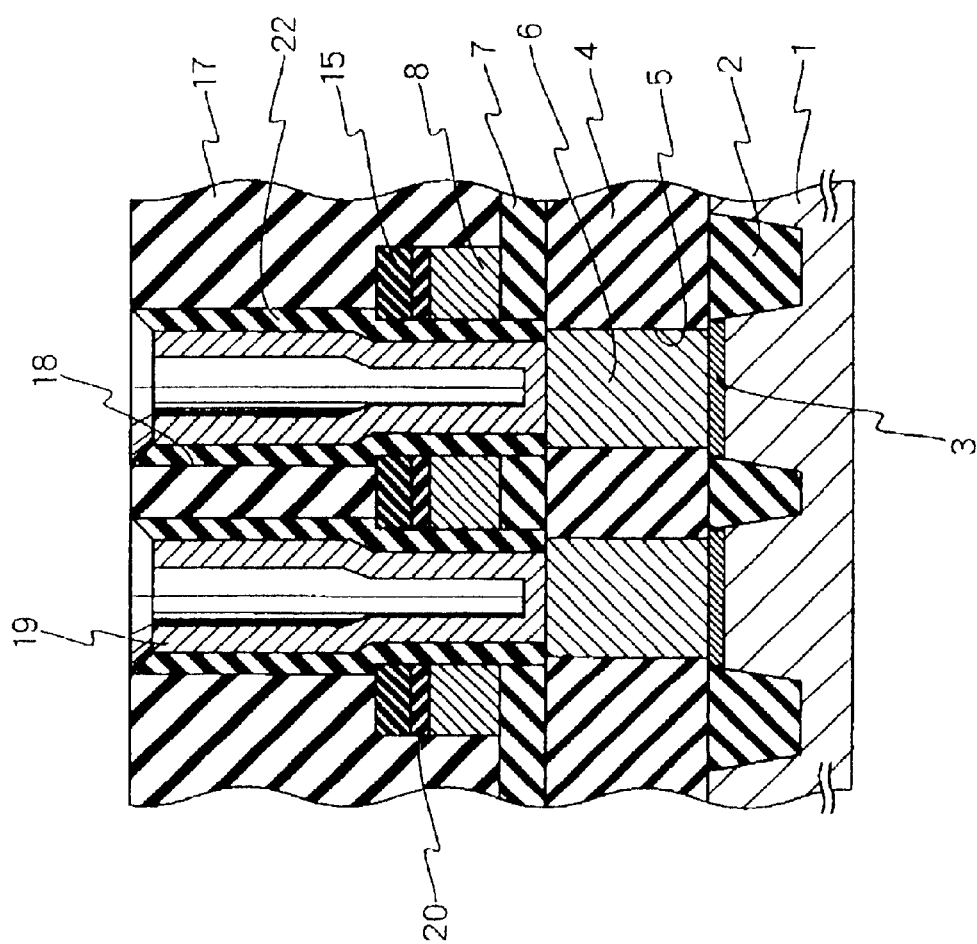

FIG. 4C is a cross-sectional view of the dynamic random access memory in accordance with the third embodiment.

The dynamic random access memory is comprised of a semiconductor substrate 1 on which a circuit is formed, isolation regions 2 formed at a surface of the semiconductor substrate 1, a diffusion layer 3 formed at a surface of the semiconductor substrate 1 between the isolation regions 2, a first interlayer insulating 4 film formed on the semiconductor substrate 1, contact holes 5 being formed through the first interlayer insulating film 4 between later mentioned adjacent bit lines 8 such that the contact holes 5 reach the diffusion layer 3, first electrically conductive layers 6 buried in the contact holes 5, a third interlayer insulating film 7 formed on the first interlayer insulating film 4 and having openings in alignment with the contact holes 5, a plurality of bit lines 8 formed on the third interlayer insulating film 7, a third insulating film 20 formed on each of the bit lines 8, a first insulating film 15 formed on the third insulating film 20, a second interlayer insulating film 17 formed on the third interlayer insulating film 7 such that the second interlayer insulating film 17 covers the first and third insulating films 15 and 20 and each of the bit lines 8 therewith, recesses 18 being formed throughout the second and third interlayer insulating films 17 and 7 and reaching the first electrically conductive films 16, a fourth insulating film 22 covering an inner surface of the recess 18 and side surfaces of the first insulating layer 15, the third insulating layer 20, the bit line 8, and the third interlayer insulating film 7, and a second electrically conductive layer 19 covering a surface of each of the fourth insulating layers 22 and a bottom of each of the recesses 18 therewith.

The first insulating film 15 is composed of silicon nitride, and the second interlayer insulating film 17, the third interlayer insulating film 7, the third insulating film 20, and the fourth insulating film 22 are all composed of silicon dioxide.

Hereinbelow is explained a method of fabricating the dynamic random access memory in accordance with the third embodiment, with reference to FIGS. 4A to 4C.

First, the steps having been explained with reference to FIGS. 3A and 3B are carried out.

Then, as illustrated in FIG. 4A, the second interlayer insulating film 17 is formed entirely over the second insulating film 15 and the third interlayer insulating film 7. The second interlayer insulating film 17 has a thickness of 1 $\mu$m. Then, the second interlayer insulating film 17 is planarized by CMP. In the third embodiment, the second insulating film 16 is not formed.

Then, a photoresist film (not illustrated) is formed on the second interlayer insulating film 17. Then, the photoresist film is patterned by photolithography and etching. Then, the second interlayer insulating film 17 is dry-etched with the patterned photoresist film being used as a mask, under conditions for etching a silicon dioxide film relative to a silicon nitride film with a sufficiently high selection ratio. For instance, the second interlayer insulating film 17 is dry-etched through the use of a mixture gas of $CHF_3$ and CO.

As a result, there are formed the recesses 18 throughout the second and third interlayer insulating films 17 and 7. Each of the recesses 18 reaches the first electrically conductive layer 6.

Then, as illustrated in FIG. 4B, the product as illustrated in FIG. 4A is entirely oxidized to thereby form a silicon dioxide film at a surface of the product. The thus formed silicon dioxide film has a thickness of 500 angstroms. Then, the silicon dioxide film formed on the second interlayer insulating film 17 is etched back by anisotropic dry etching. As a result, the silicon dioxide film remains non-etched only both on an inner surface of the recess 18 and on the first electrically conductive film 6. Then, the silicon dioxide film formed on the first electrically conductive film 6 is removed. Thus, the fourth insulating film 22 is formed on an inner surface of each of the recesses 18.

Then, as illustrated in FIG. 4C, the recesses 18 are filled with polysilicon having a thickness of 800 angstroms. Then, the polysilicon is patterned by photolithography and dry etching to thereby form the lower electrode 19 in each of the recesses 18.

In the third embodiment, since the dynamic random access memory includes the fourth insulating film 22 in place of the second insulating film 16, it would be possible to make a capacity of the bit lines 8 smaller than a capacity of the bit lines 8 in the second embodiment, ensuring reduction in data delay in comparison with the second embodiment. Similarly to the first embodiment, the third insulating film 20 may be omitted.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 11-240852 filed on Aug. 27, 1999 including specification, claims, drawings and summary is incorporated herein by reference in its entirety.

What is claimed is:

1. A semiconductor memory device comprising:
   (a) a semiconductor substrate on which a circuit is formed;
   (b) a first interlayer insulating film formed on said semiconductor substrate;
   (c) a plurality of bit lines formed on said first interlayer insulating film, a contact hole being formed through said first interlayer insulating film between adjacent bit lines such that said contact hole reaches said semiconductor substrate;
   (d) a second interlayer insulating film formed on said first interlayer insulating film such that said second interlayer film covers said bit lines therewith;
   (e) a first electrically conductive layer buried in said contact hole, a recess being formed through said second interlayer insulating film between adjacent bit lines such that said recess reaches said first electrically conductive layer;
   (f) a second electrically conductive layer covering a bottom and an inner sidewall of said recess therewith such that said second electrically conductive layer is electrically isolated from said bit lines; and
   (g) an insulating film covering upper and side surfaces of said bit lines therewith, said insulating film formed around a first bit line and said insulating film formed around a second bit line adjacent to said first bit line both partially defining a part of said inner sidewall of said recess, said bottom of said recess being extensive between said insulating films.

2. The semiconductor memory device as set forth in claim 1, wherein said insulating film is composed of silicon nitride, and said second interlayer insulating film is composed of silicon dioxide.

3. The semiconductor memory device as set forth in claim 2, further comprising a second insulating film sandwiched between each of said bit lines and said insulating film.

4. The semiconductor memory device as set forth in claim 3, wherein said insulating film is composed of silicon nitride, said second interlayer insulating film is composed of silicon dioxide, and said second insulating film is composed of silicon dioxide.

5. The semiconductor memory device as set forth in claim 1, further comprising a third interlayer insulating film sandwiched between said first and second interlayer insulating films, said bit lines being formed on said third interlayer insulating film, said recess being formed through said second and third interlayer insulating films between adjacent bit lines such that said recess reaches said first electrically conductive layer.

6. The semiconductor memory device as set forth in claim 5, wherein said third interlayer insulating film is composed of silicon dioxide.

7. A semiconductor memory device comprising:
   (a) a semiconductor substrate on which a circuit is formed;
   (b) a first interlayer insulating film formed on said semiconductor substrate;
   (c) a plurality of bit lines formed on said first interlayer insulating film, a contact hole being formed through said first interlayer insulating film between adjacent bit lines such that said contact hole reaches said semiconductor substrate;
   (d) a first insulating film covering an upper surface of each of said bit lines therewith;
   (e) a second interlayer insulating film formed on said first interlayer insulating film such that said second interlayer insulating film covers both said first insulating film and said bit lines therewith;
   (e) a first electrically conductive layer buried in said contact hole, a recess being formed through said second interlayer insulating film between adjacent bit lines such that said recess reaches said first electrically conductive layer;
   (f) a second insulating film formed on an inner sidewall of said recess; and
   (g) a second electrically conductive layer formed on said second insulating film and covering a bottom of said recess therewith.

8. The semiconductor memory device as set forth in claim 7, wherein said first insulating film is composed of silicon nitride, said second interlayer insulating film is composed of silicon dioxide, and said second insulating film is composed of silicon dioxide.

9. The semiconductor memory device as set forth in claim 7, further comprising a third insulating film sandwiched between each of said bit lines and said first insulating film.

10. The semiconductor memory device as set forth in claim 7, wherein said third insulating film is composed of silicon dioxide.

11. The semiconductor memory device as set forth in claim 7, further comprising a third interlayer insulating film sandwiched between said first and second interlayer insulating films, said bit lines being formed on said third interlayer insulating film, said recess being formed through said second and third interlayer insulating films between adjacent bit lines such that said recess reaches said first electrically conductive layer.

12. The semiconductor memory device as set forth in claim 11, wherein said third interlayer insulating film is composed of silicon dioxide.

* * * * *